United States Patent
Dorf et al.

(10) Patent No.: US 9,082,591 B2
(45) Date of Patent: Jul. 14, 2015

(54) THREE-COIL INDUCTIVELY COUPLED PLASMA SOURCE WITH INDIVIDUALLY CONTROLLED COIL CURRENTS FROM A SINGLE RF POWER GENERATOR

(71) Applicant: APPLIED MATERIALS, INC., Santa Clara, CA (US)

(72) Inventors: Leonid Dorf, San Jose, CA (US); Shahid Rauf, Pleasanton, CA (US); Jonathan Liu, Sunnyvale, CA (US); Jason A. Kenney, Sunnyvale, CA (US); Andrew Nguyen, San Jose, CA (US); Kenneth S. Collins, San Jose, CA (US); Kartik Ramaswamy, San Jose, CA (US); Steven Lane, Porterville, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 275 days.

(21) Appl. No.: 13/863,614

(22) Filed: Apr. 16, 2013

(65) Prior Publication Data

US 2013/0278142 A1    Oct. 24, 2013

Related U.S. Application Data

(63) Continuation-in-part of application No. 13/836,890, filed on Mar. 15, 2013.

(60) Provisional application No. 61/637,468, filed on Apr. 24, 2012.

(51) Int. Cl.
*H01J 7/24* (2006.01)
*H05B 31/26* (2006.01)
*H01J 37/32* (2006.01)

(52) U.S. Cl.
CPC ..... *H01J 37/32183* (2013.01); *H01J 37/32082* (2013.01)

(58) Field of Classification Search
USPC ......................................... 315/111.21, 111.41
See application file for complete search history.

(56) References Cited

U.S. PATENT DOCUMENTS

| | | | |
|---|---|---|---|
| 6,409,933 B1 | 6/2002 | Holland et al. | |
| 6,414,648 B1 | 7/2002 | Holland et al. | |
| 6,462,481 B1 * | 10/2002 | Holland et al. | ........... 315/111.21 |
| 6,463,875 B1 | 10/2002 | Chen et al. | |
| 6,685,798 B1 | 2/2004 | Holland et al. | |
| 6,694,915 B1 | 2/2004 | Holland et al. | |
| 6,893,533 B2 | 5/2005 | Holland et al. | |
| 7,422,654 B2 * | 9/2008 | Lindley et al. | ........... 156/345.46 |
| 8,753,474 B2 * | 6/2014 | Nangoy et al. | ........... 156/345.33 |

(Continued)

FOREIGN PATENT DOCUMENTS

WO    WO-02084698 A1    10/2012

OTHER PUBLICATIONS

U.S. Appl. No. 13/836,890, filed Mar. 15, 2013, Dorf et al.

(Continued)

*Primary Examiner* — Adam Houston
(74) *Attorney, Agent, or Firm* — Robert M. Wallace

(57) ABSTRACT

An inductively coupled plasma reactor has three concentric coil antennas and a current divider circuit individually controlling currents in each of the three coil antennas by varying two variable impedance elements in the current divider circuit in response to a desired current apportionment among the coil antennas received from a user interface.

20 Claims, 17 Drawing Sheets

(56) References Cited

U.S. PATENT DOCUMENTS

| | | | |
|---|---|---|---|
| 2003/0047449 A1* | 3/2003 | Hanawa et al. | 204/298.06 |
| 2004/0107908 A1* | 6/2004 | Collins et al. | 118/723.001 |
| 2004/0182319 A1 | 9/2004 | Kim et al. | |
| 2004/0200417 A1* | 10/2004 | Hanawa et al. | 118/723.001 |
| 2005/0136604 A1* | 6/2005 | Al-Bayati et al. | 438/301 |
| 2005/0167051 A1* | 8/2005 | Hoffman et al. | 156/345.46 |
| 2006/0027168 A1 | 2/2006 | Matsuda et al. | |
| 2007/0257008 A1* | 11/2007 | Chandrachood et al. | 216/67 |
| 2009/0096413 A1* | 4/2009 | Partovi et al. | 320/108 |
| 2010/0243162 A1* | 9/2010 | Koshimizu | 156/345.28 |
| 2011/0201134 A1* | 8/2011 | Hoffman et al. | 438/5 |
| 2013/0278141 A1* | 10/2013 | Dorf et al. | 315/111.41 |
| 2013/0278142 A1* | 10/2013 | Dorf et al. | 315/111.41 |

OTHER PUBLICATIONS

Official Action dated Feb. 26, 2015 issued in Co-Pending U.S. Appl. No. 13/836,890.

* cited by examiner

US 9,082,591 B2

THREE-COIL INDUCTIVELY COUPLED PLASMA SOURCE WITH INDIVIDUALLY CONTROLLED COIL CURRENTS FROM A SINGLE RF POWER GENERATOR

CROSS-REFERENCE TO RELATED APPLICATIONS

This application is a continuation-in-part of U.S. application Ser. No. 13/836,890 filed Mar. 15, 2013 entitled THREE-COIL INDUCTIVELY COUPLED PLASMA SOURCE WITH INDIVIDUALLY CONTROLLED COIL CURRENTS FROM A SINGLE RF POWER GENERATOR, by Leonid Dorf, et al., which claims the benefit of U.S. Provisional Application Ser. No. 61/637,468 filed Apr. 24, 2012 entitled THREE-COIL INDUCTIVELY COUPLED PLASMA SOURCE WITH INDIVIDUALLY CONTROLLED COIL CURRENTS FROM A SINGLE RE POWER GENERATOR, by Leonid Dorf, at al.

BACKGROUND

The recent growth in size semiconductor wafers in integrated circuit fabrication is making it more difficult to obtain the needed degree of uniformity of plasma process rate across the treated surface of the wafer. The process rate may be an etch rate or a deposition rate, for example. Plasma processing tools for processing 300 mm diameter wafers employ a pair of concentric coils (coil antennas), namely an inner coil and an outer coil, to control uniformity of radial distribution of process rate. The RF power levels applied to the different coils are selected to counteract non-uniformities. For 450 mm diameter wafers, we feel that three separately powered RF coils are needed. Separate adjustment of the different RF power levels delivered to the three different coils would provide finer control of uniformity. Impedance matching is required for ail three coils. The problem is that operation of the impedance match and control of the different power levels delivered to the different coils is unpredictable and complicated by internal resonances and mutual inductances among the three coils and between the coils and the plasma. A related problem is that varying the three different power levels in an effort to improve uniformity may cause the system to enter resonant modes, in which plasma instabilities can arise. Resonances also cause very high RF voltages to appear on the coils and their circuit elements, which can cause arcing.

SUMMARY

A plasma reactor for processing a workpiece includes an RF power generator, an impedance match coupled to the RF power generator, and three coil antennas having respective driven ends and return ends, the return ends being connected to a common potential. Three current divider branches are coupled between the impedance match and the driven end, of respective ones of the coil antennas, a pair of the three current divider branches comprising respective variable impedance elements. A user interface is provided. A current apportionment controller controls impedances of the variable impedance elements of the pair of current divider branches in response to a desired apportionment of currents to the three coil antennas defined at the user interface.

In one embodiment, the current apportionment controller comprises a look-up table storing a sequence of pairs of impedance values of the variable impedance elements. The sequence of pairs of values defines a linear programming sequence. In one embodiment, the user interlace is adapted to record a user-selected point along the path and transmit the user-selected point to the current apportionment controller.

In one embodiment, the sequence of pairs of values defines a path in a 2-dimensional space whose dimensions are the impedance values of the variable impedance elements. In a related embodiment, the path includes: (a) a reference point at which currents in the three coil antennas are at least approximately equal, (b) a first point at which current in a first one of the coil antennas, relative to currents a second and third one of the coil antennas, is near a maximum, (c) a second point at which current in the second coil antenna, relative to currents in the first and third coil antennas, is near a maximum, and (d) a third point at which current in the third coil antenna, relative to currents in the first and second coil antennas, is near a maximum.

In one embodiment, the apportionment controller comprises; (a) a memory containing data representing respective currents in the three coil antennas relative to total current as functions of values of the variable impedance elements, and (b) a processor for determining from the data the impedance values of the variable impedance elements at which the respective currents in the three coil antennas at least nearly correspond to the desired apportionment.

In accordance with another aspect, a method is provided for individually controlling currents in three coil antennas of a plasma reactor supplied from an RF generator through an RF impedance match. The method includes: (a) providing respective current divider branches between the impedance match and respective ones of the coil antennas, each of at least two of the current divider branches comprising a respective variable impedance element; (b) providing a model comprising a first set of equations defining voltage drops in the current divider branches in accordance with mutual inductances of the coil antennas and corresponding portions of a plasma in the reactor and a second set of equations defining voltage drops in the corresponding portions of the plasma in accordance with the mutual inductances (c) solving the first and second sets of equations for currents in the coil antennas relative to total current as 3-dimensional functions of impedance values of the variable impedance elements in the at least two current divider branches; and (d) correlating information corresponding to the functions to a user-defined apportionment of currents in the coil antennas.

In one embodiment of the method, the correlating comprises: (a) searching the functions for respective points in a space representing pairs of values of the variable impedance elements at which coil currents are maximum for respective ones of the coil antennas; (b) defining a linear programming path that includes the respective points; and (c) enabling a user to select a location on the linear programming path to control impedance values of the variable impedance elements.

In a related embodiment, the correlating further comprises searching the functions for a set of impedance values of the variable impedance elements corresponding to an apportionment of currents among the coil antennas that at least nearly approximates a user-defined apportionment.

In accordance with a yet further aspect, a method is provided for individually controlling currents in three coil antennas of a plasma reactor supplied from an RF generator through an RF impedance match. The method includes: (a) providing respective current divider branches between the impedance match and respective ones of the coil antennas, at least two of the current divider branches comprising respective variable impedance elements; and (b) correlating information, corresponding to coil antenna currents as 3-dimensional functions of impedance values of the variable impedance elements, to a user-defined apportionment of currents in the coil antennas.

In one embodiment, the correlating comprises: (a) defining respective points in a space representing pairs of values of the variable impedance elements at which coil antenna currents are maximum for respective ones of the coil antennas; (b) defining a linear programming path that includes the respective points; and (c) enabling a user to select a location on the linear programming path to control impedance values of the variable impedance elements.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
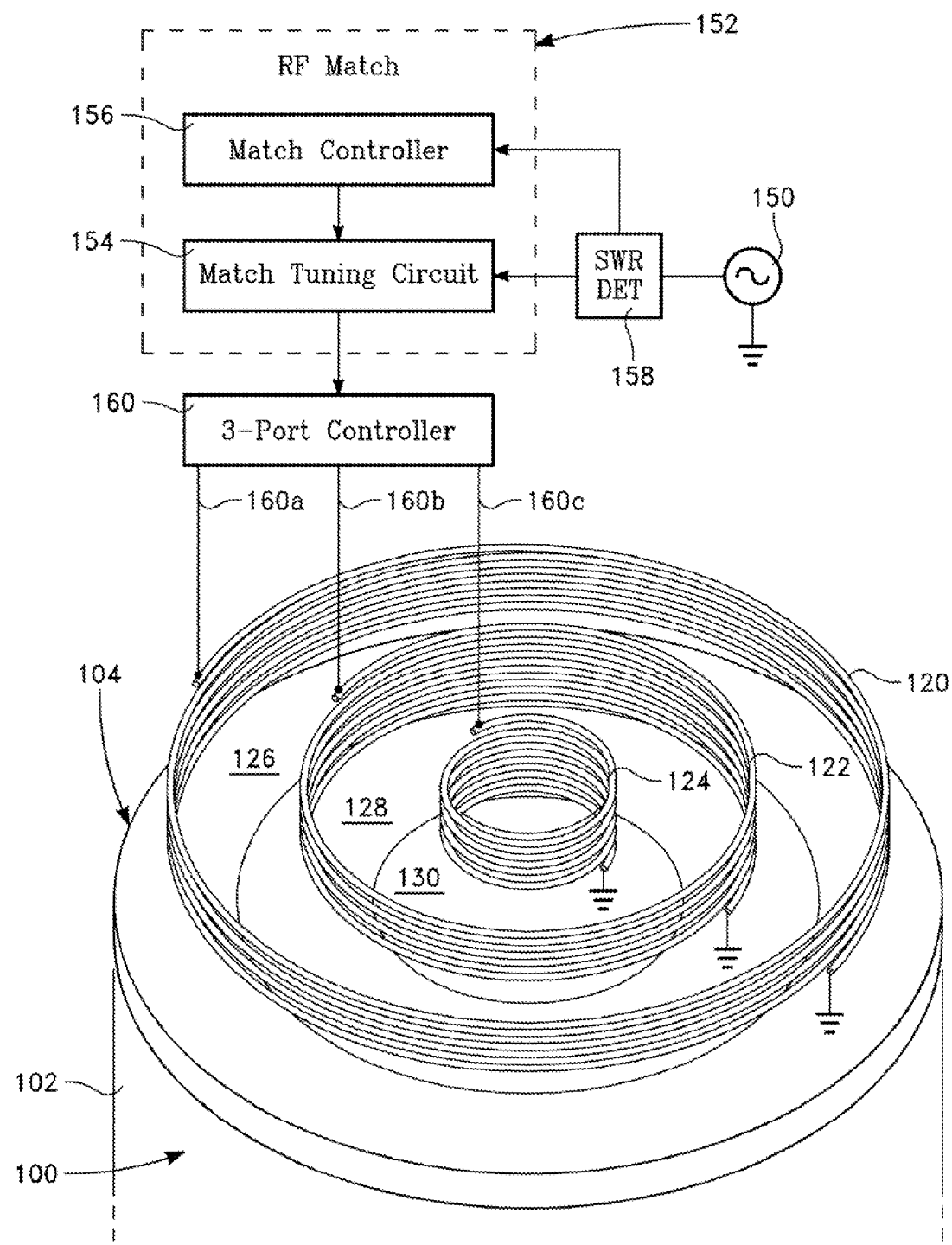
FIGS. 1A, 1B and 1C depict a plasma reactor in accordance with one embodiment.

To facilitate understanding, identical reference numerals have been used, where possible, to designate identical elements that are common to the figures. It is contemplated that elements and features of one embodiment may be beneficially incorporated in other embodiments without further recitation. It is to foe noted, however, that the appended drawings illustrate only exemplary embodiments of this invention and are therefore not to foe considered limiting of its scope, for the invention may adroit to other equally effective embodiments.

DETAILED DESCRIPTION

Figure 1B:
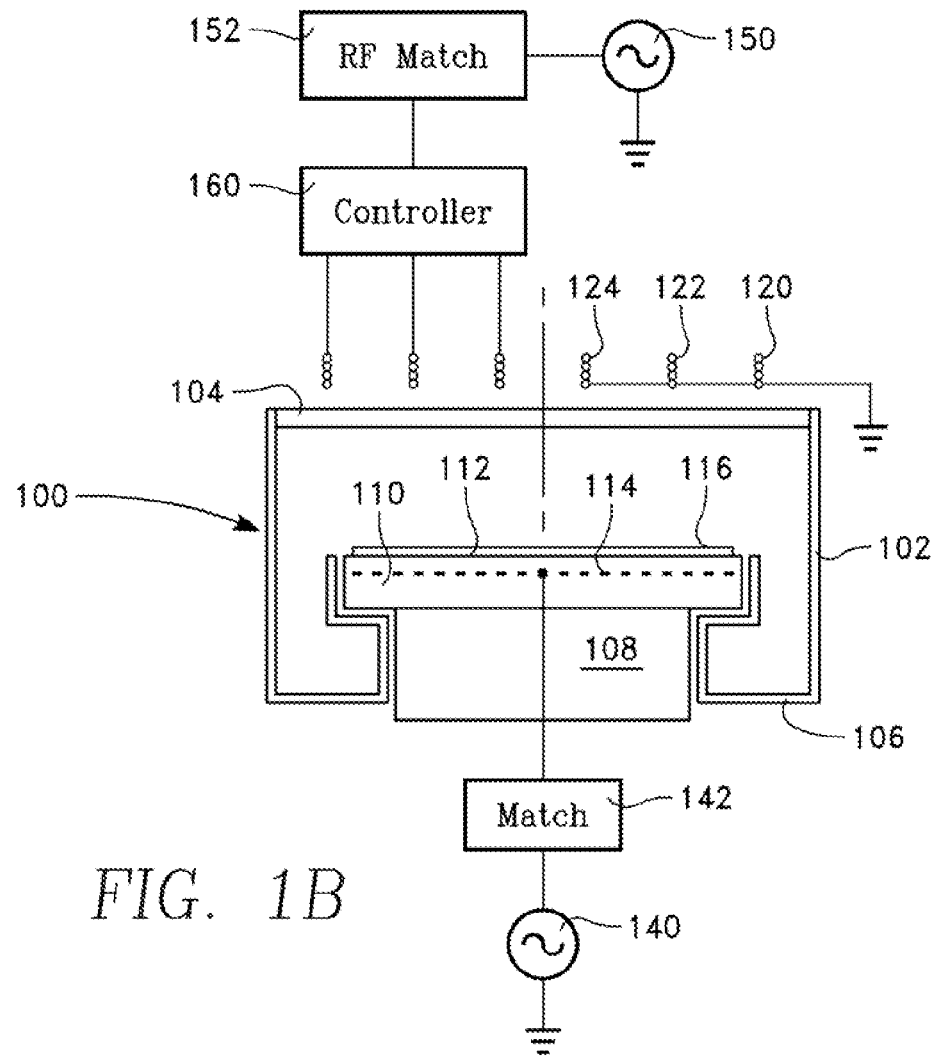
Figure 1C:
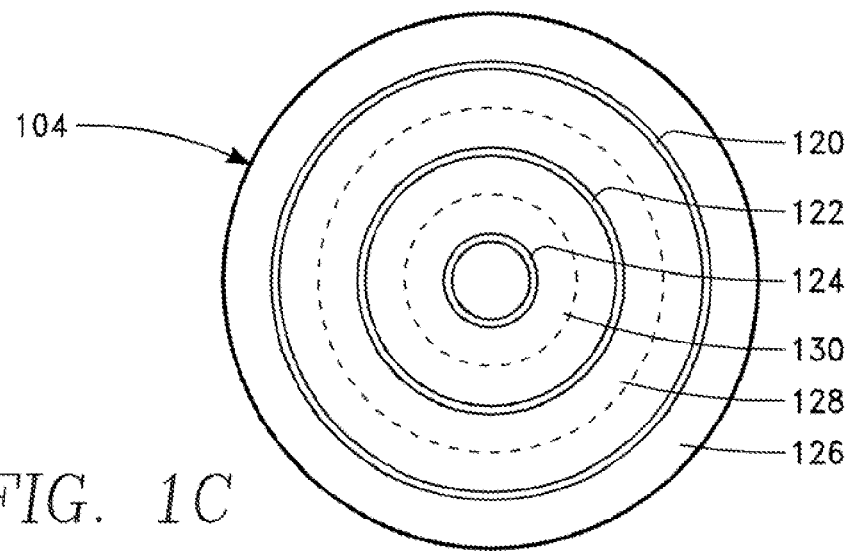

Referring to FIGS. 1A and 1B, a plasma reactor includes a vacuum chamber enclosure 100 including a cylindrical side wall 102, a disk shaped ceiling 104 and a chamber floor 106. A support pedestal 108 extends through the floor and holds a workpiece support 110 having a workpiece support surface 112 and an internal workpiece support electrode 114 beneath and insulated from the support surface 112. A planar workpiece 116, such as a semiconductor wafer, a photolithographic mask, a precursor for a plasma display or a solar cell array, may be held on the support surface 112 for plasma processing. Three (or more) RF coil antennas 120, 122, 124, are disposed over the ceiling 104 in alignment with respective concentric circular (annular) zones 126, 128, 130 (FIG. 1C) coaxial with an axis of symmetry of the chamber enclosure 100.

In one embodiment, an RF bias power generator 140 is coupled through a RF bias impedance match 142 to the workpiece support electrode 114.

An RF source power generator 150 has an output terminal coupled through an RF impedance match 152 to a three port controller 160 and return terminal connected to RF ground. The impedance match 152 consists of a match tuning circuit 154 and a match controller 156 governing the match tuning circuit 154 in accordance with the output of a standing wave ratio (SWR) detector 158 disposed at or in series with the output of the RF source power generator 150. The SWR detector 158 measures the ratio between forward and reflected power or voltage, and may be a conventional RF device such as a dual directional coupler, for example. The three port controller 160 has three outputs 160a, 160b and 160c coupled to the three RF coils 120, 122 and 124 respectively. The currents provided at the outputs 160a, 160b and 160c are separately adjustable relative to total current, as will be described below.

Figure 2:
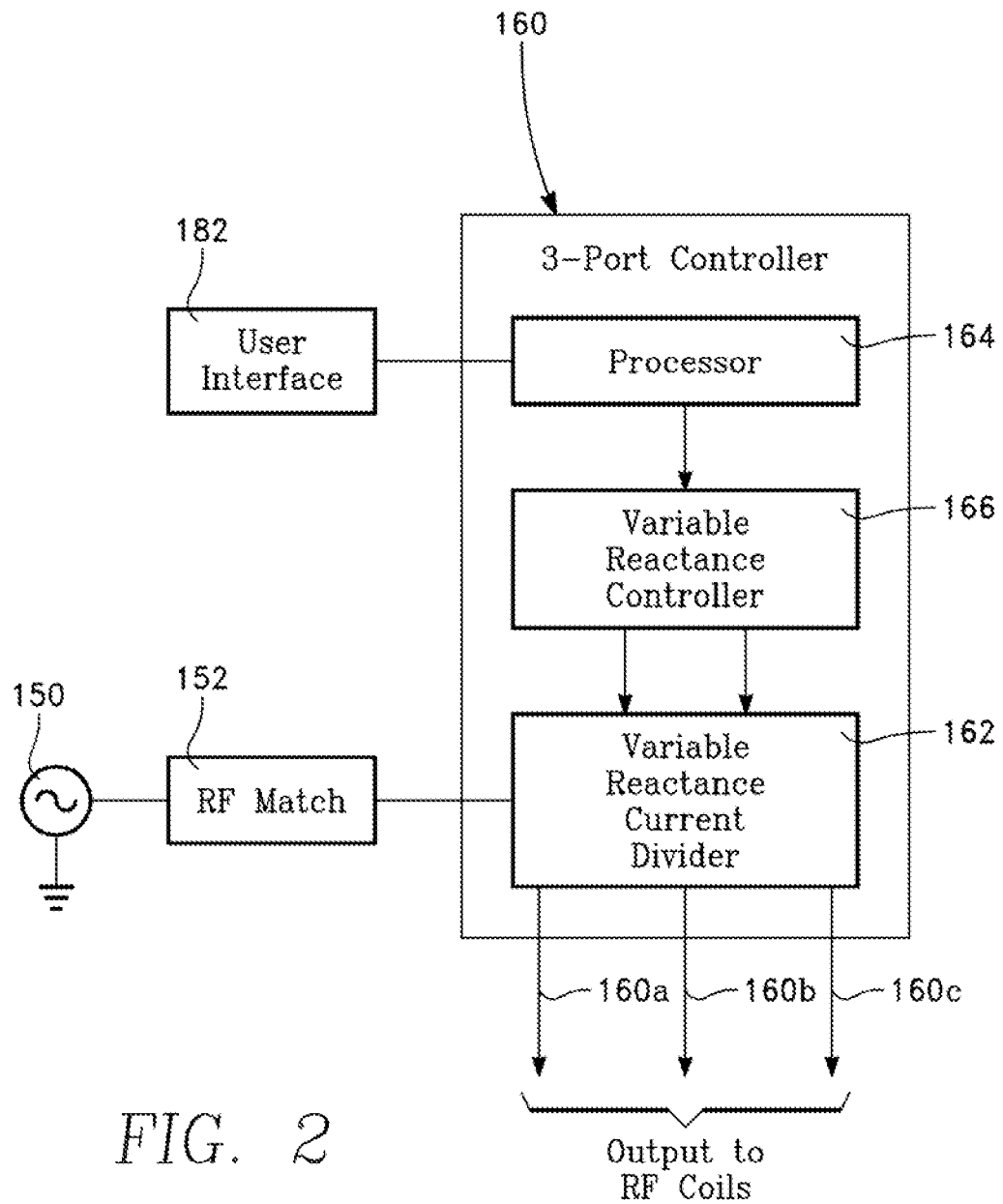
FIG. 2 is a schematic block diagram depicting an embodiment of a 3-port controller of FIG. 1A.

Referring to FIG. 2, the three port controller 160 includes a variable reactance current divider 162 coupled between the output of the impedance match 152 and the outputs 160a, 160b and 160c. As will be described in detail below, the variable reactance current divider 162 includes plural variable reactive elements (not shown in FIG. 2) such as variable capacitors or variable inductors, whose adjustment controls the apportionment of currents at the three outputs 160a, 160b and 160c. This adjustment is performed under control of a processor 164, in response to user preferences for apportionment of currents among the three RF coil antennas 120, 122 and 124. As will be described in detail below, the processor 164 may translate a user preference for apportionment of the three currents to specific values of the variable reactances of the variable reactance current divider 162. A variable reactance controller 166 may convert the specific variable reactance values furnished by the processor 164 to corresponding commands that produce the desired reactance values in the variable reactance current divider 162. For example, the variable reactance elements may be capacitors with stepper motors governed by the commands. In the most practical embodiment, the user may control the variable reactances by following a pre-established linear programming path that covers nearly all possibilities, as will be described later in this specification.

Figure 3A:
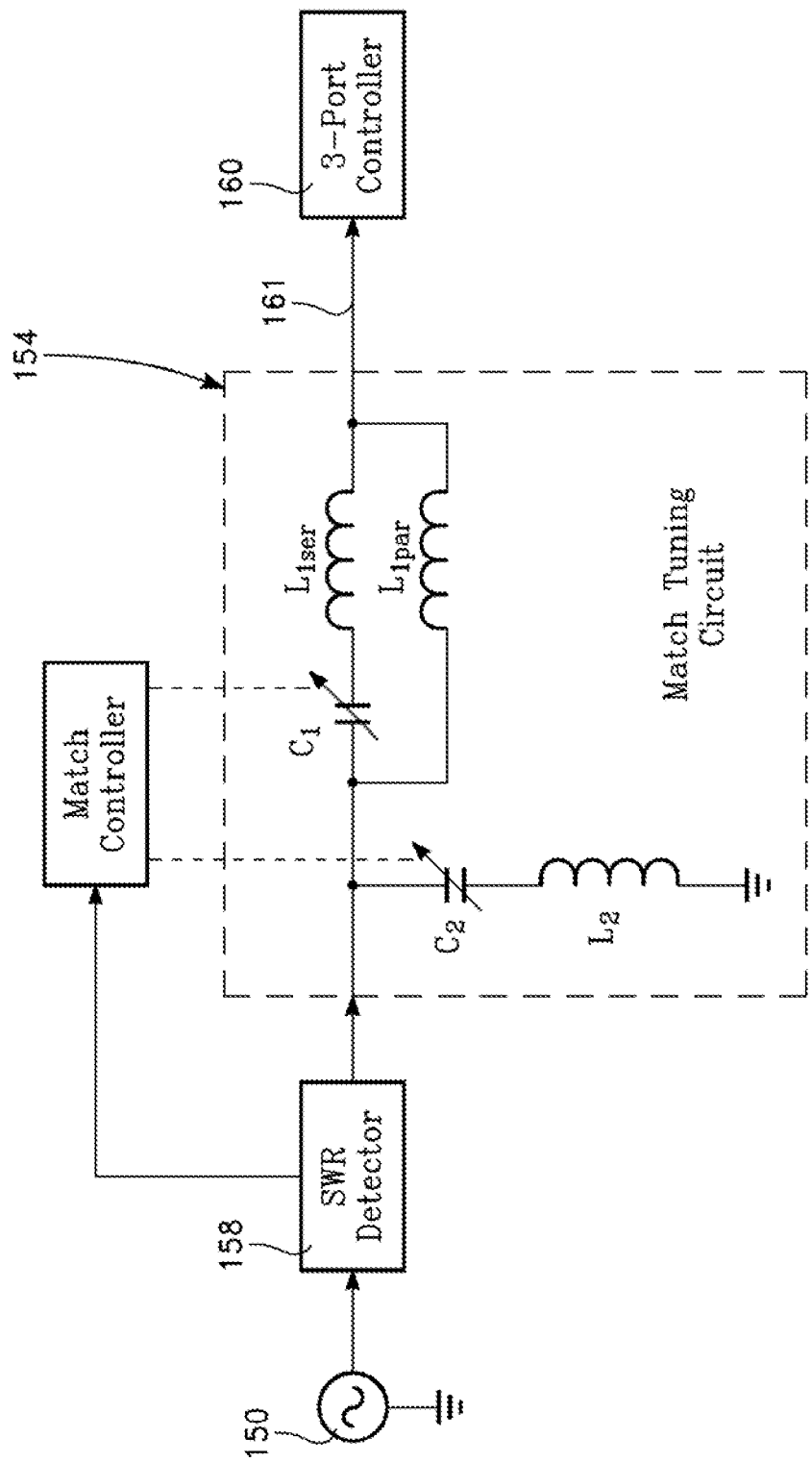
FIG. 3A is a schematic diagram depicting internal structure in one embodiment of an impedance match of FIG. 1A.
Figure 3B:
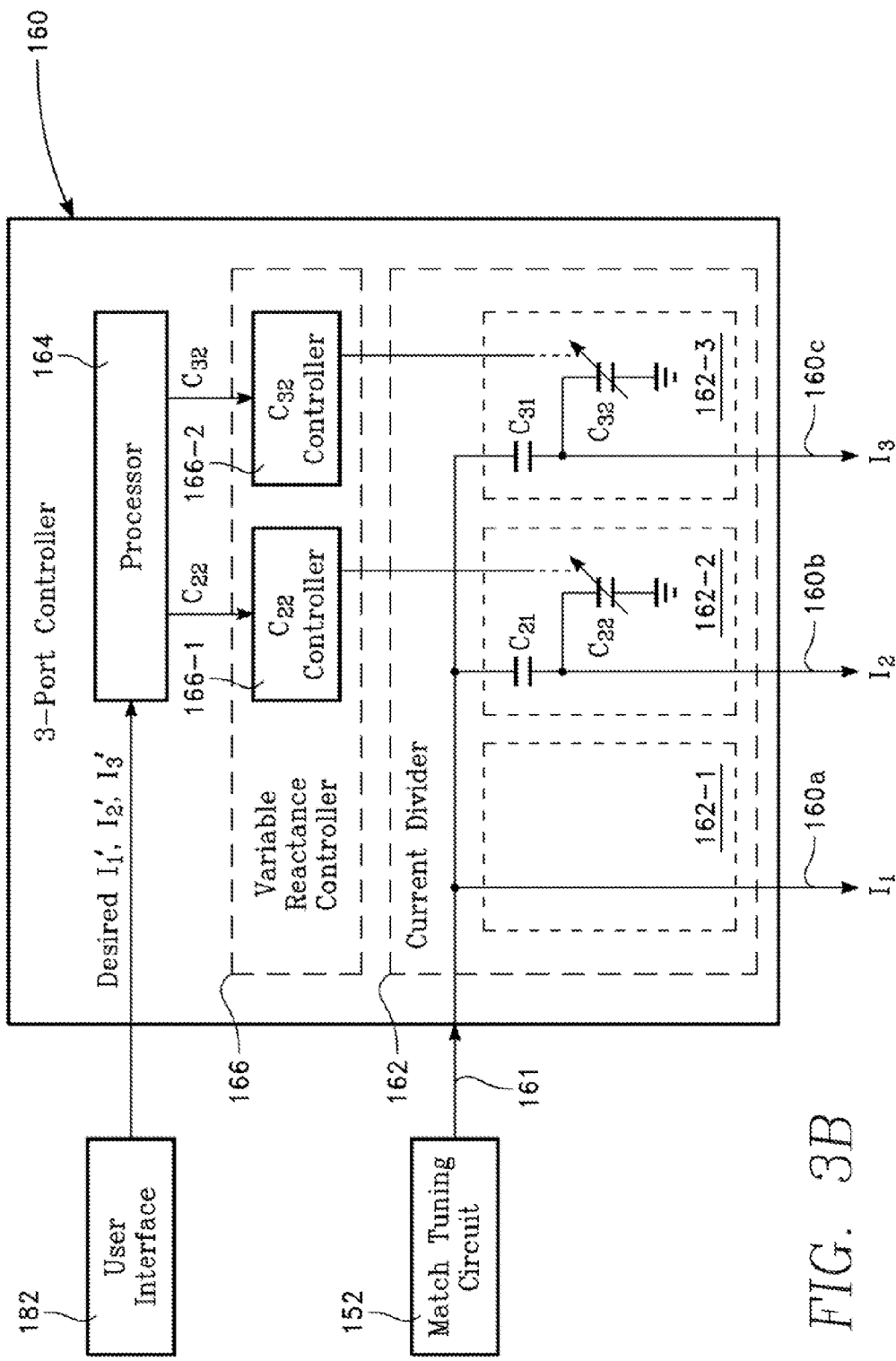
FIG. 3B is a schematic diagram depicting internal structure in one embodiment of the three port controller of FIG. 2.

An embodiment of the match tuning circuit 154 is depicted in FIG. 3A, and an embodiment of the variable reactance current divider 162 is depicted in FIG. 3B. The match tuning circuit 154 of FIG. 3A includes a variable load capacitor C1 connected in series with a series inductor L1ser between the RF source power generator 150 and a power input 161 of the three port controller 160. A parallel inductor L1par is connected across the series combination of the load capacitor C1 and the inductor L1ser. The match timing circuit 154 further includes a variable tune capacitor C2 coupled between the output terminal of the RF generator 150 and RF ground through a series inductor L2.

The variable reactance current divider 162 has three parallel branches 162-1, 162-2 and 162-3 coupled between the power input 161 and the three outputs 160a, 160b and 160c to the respective RF coils 120, 122 and 124. The first branch 162-1 has no discrete impedance elements and is simply a conductor providing in effect a D.C. short. The second branch 162-2 consists of a series reactive element connected in series with the middle coil 122 and a parallel variable reactive element connected in parallel with the middle coil 122. In the illustrated embodiment of the second branch 162-2, the series reactive element is a capacitor C21 while the parallel variable reactive element is a variable capacitor C22. Similarly, the third branch 162-3 consists of a series reactive element connected in series with the inner coil 124 and a parallel variable reactive element connected in parallel with the inner coil 124. In the illustrated embodiment of the third branch 162-3, the series reactive element is a capacitor C31 while the parallel variable reactive element is a variable capacitor C32. In the embodiment of FIG. 3B, the variable reactance controller 166 includes a first controller 166-1 that translates a first capacitance value received from the processor 164 to a command for the variable capacitor C22, and a second controller 166-2 that translates another capacitance value received from the processor 164 to command for the variable capacitor C32.

Figure 4:
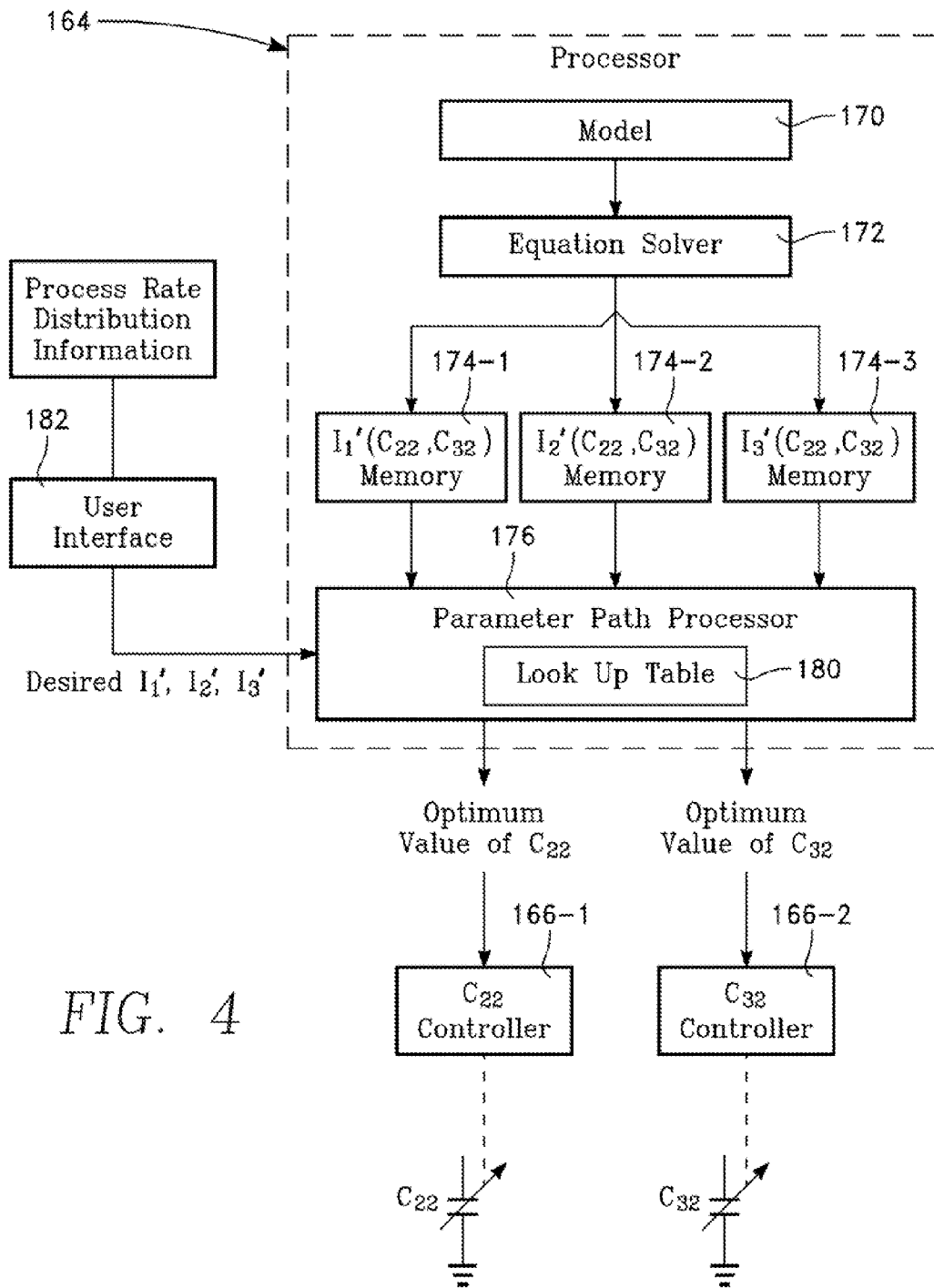
FIG. 4 is a schematic block diagram depicting architecture of an embodiment of a processor of the three port controller of FIG. 2.

In the embodiment of FIG. 4, the processor 164 may optionally include a mathematical model 170 of the system including the variable reactance current divider 162, and an equation solver 172 adapted to employ conventional numerical methods to solve the simultaneous equations constituting the mathematical model 170. The results are stored, in look-up tables, as will be described below. The look-up tables may be used to obtain the best values for the variable capacitors C22 and C32 to realize a desired apportionment of currents among the different coils. As plasma conditions (particularly pressure) change, the values predicted using the results stored in the look-up tables become less accurate. But modest inaccuracies can be compensated by the user employing methods described below, without redoing the calculations involving the model. However, if plasma conditions change significantly or radically, then a new set of results must be obtained, from the model (using conventional numerical methods to solve the simultaneous equations constituting the mathematical model 170), based upon the latest values of plasma conditions (e.g., chamber pressure). The look-up tables are then updated.

The mathematical model 170 is derived in accordance with the topology of the current divider 162 and the plasma, and is as follows:

$$R_1 I_1 + i\omega \sum_{i=1-6} M_{1i} I_i = V_C \quad (1.)$$

$$\left(R_2 + \frac{1}{i\omega(C_{21}+C_{22})}\right) I_2 + i\omega \sum_{i=1-6} M_{2i} I_i = V_C \frac{C_{21}}{(C_{21}+C_{22})} \quad (2.)$$

$$\left(R_3 + \frac{1}{i\omega(C_{31}+C_{32})}\right) I_3 + i\omega \sum_{i=1-6} M_{3i} I_i = V_C \frac{C_{31}}{(C_{31}+C_{32})} \quad (3.)$$

$$Z_p I_p + i\omega \sum_{i=1-6} M_{pi} I_i = 0 \quad (4.)$$

$V_C$ is the voltage at the power input 161.

The foregoing model is based upon current functions including the complex term $e^{i\omega t}$, so that all current functions, $I_i$ and $I_p$ are actually the corresponding complex amplitudes. For any current function, the actual current that corresponds to it is given by $\text{Re}\{I_i e^{i\omega t}\}$. The useful result of solving the model 170 is the magnitudes of the three coil currents $|I_i|$ for i=1, 2, 3, which are denoted simply as $I_1$, $I_2$, $I_3$, in bold font.

Figure 5:
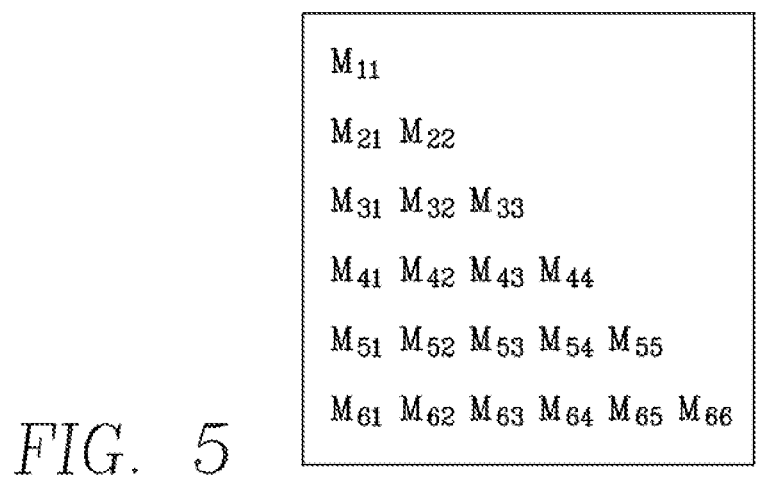
FIG. 5 depicts a matrix of mutual inductances in a model employed in the processor of FIG. 4.
Figure 6:
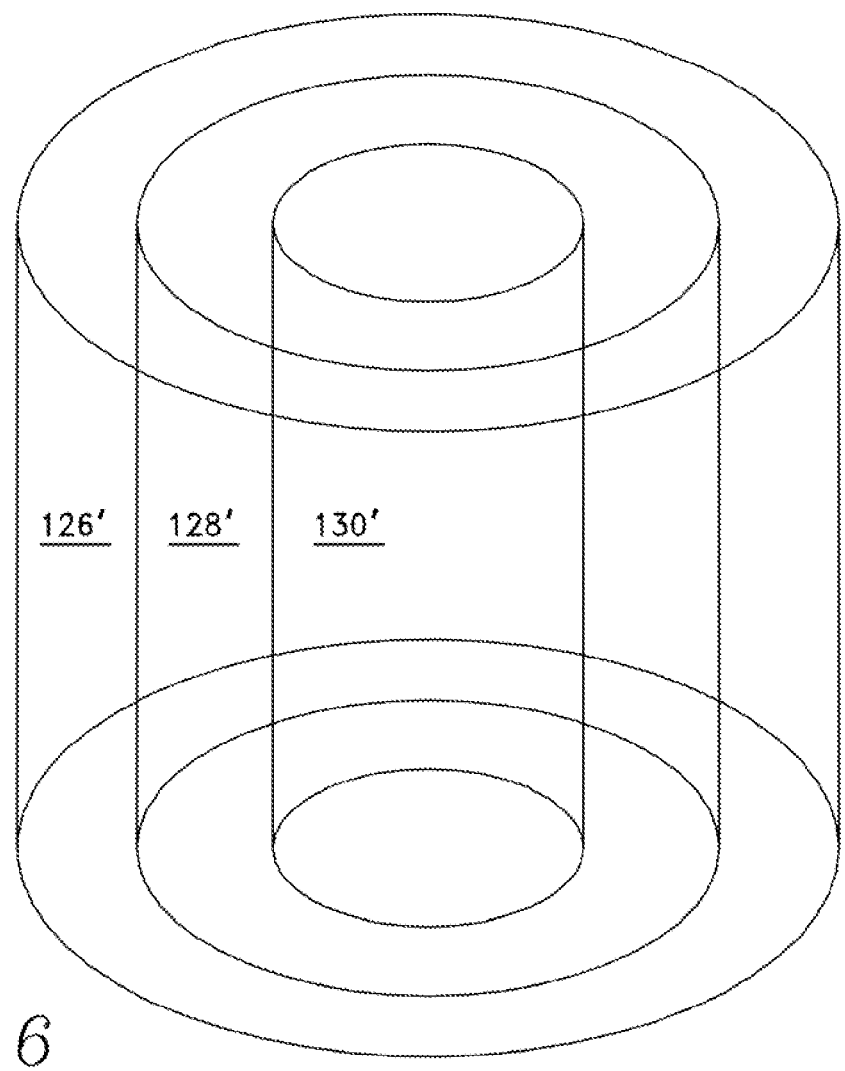
FIG. 6 depicts a definition of three plasma sections aligned with the three RF coil antennas for modeling plasma elements in the matrix of FIG. 5.

The matrix M is depicted in FIG. 5, and is symmetrical across its diagonal, and only the lower diagonal half is depicted in FIG. 5 for the sake of simplicity. The off-diagonal elements in the matrix M in the foregoing model are the mutual inductances among the three RF coils 120, 122 and 124 and the three sections of the plasma in the reactor chamber 100 underlying the three circular/annular zones 126, 128 and 130 under the respective coils. Elements on the matrix diagonal are self-inductances. The division of the plasma into three corresponding solid sections 126', 128' and 130' is depicted in FIG. 6. The subscripted indices of the matrix elements in M denote the elements mutually coupled as follows: the three coils 120, 122 and 124 correspond to indices 1, 2 and 3 respectively; the three plasma sections 126', 128' and 130' correspond to indices 4, 5 and 6, respectively. Each of the matrix elements is computed based upon the geometry of the reactor. In turn, the plasma impedance, $Z_p$, depends upon the pressure in the chamber containing the plasma.

Equation (1) expresses the voltage drops attributable to current in the first coil 120 and the mutual inductances involving the first coil 120. Equation (2) expresses the voltage drops attributable to current in the second coil 122 and the mutual inductances involving the second coil 122. Equation (3) expresses the voltage drops attributable to current in the third coil 124 and the mutual inductances involving the third coil 124. Equation (4) expresses, in a compressed manner, the voltage drops attributable to individual currents through the plasma sections 126', 128' and 130' and the mutual, inductances involving the respective plasma sections.

Equation (4) is actually three equations, one for each value of the subscripted index p, ranging from 4 to 6, corresponding to the three plasma sections 126', 128' and 130'. In equation (4), the $Z_p$ is the complex plasma impedance, and is computed from the plasma resistance $R_p$ as follows:

$$Z_p = R_p(1+j\omega/\nu)$$

where $j=(-1)^{1/2}$, $\omega$ is the angular frequency of the RF source power generator 150, and $\nu$ is the mean electron collision frequency in the plasma. The plasma resistance $R_p$ of each plasma section and the collision frequency $\nu$ is determined from plasma conditions in accordance with conventional principles. In particular, the collision frequency $\nu$ is determined from the pressure of chamber containing the plasma. Thus, the complex plasma impedance is a function of pressure. The model provides accurate results if an accurate value of chamber pressure was used, to determine the plasma resistance $R_p$ and the model may continue to be used until a significant change in chamber pressure is sensed by the processor 164. When that occurs, the equations of the model must be updated according to the latest values of plasma conditions (e.g., pressure), and solved. The processor 164 may monitor chamber pressure using a pressure sensor (not illustrated) coupled to or inside of the chamber, to determine whether the model needs to be updated.

Figure 7:
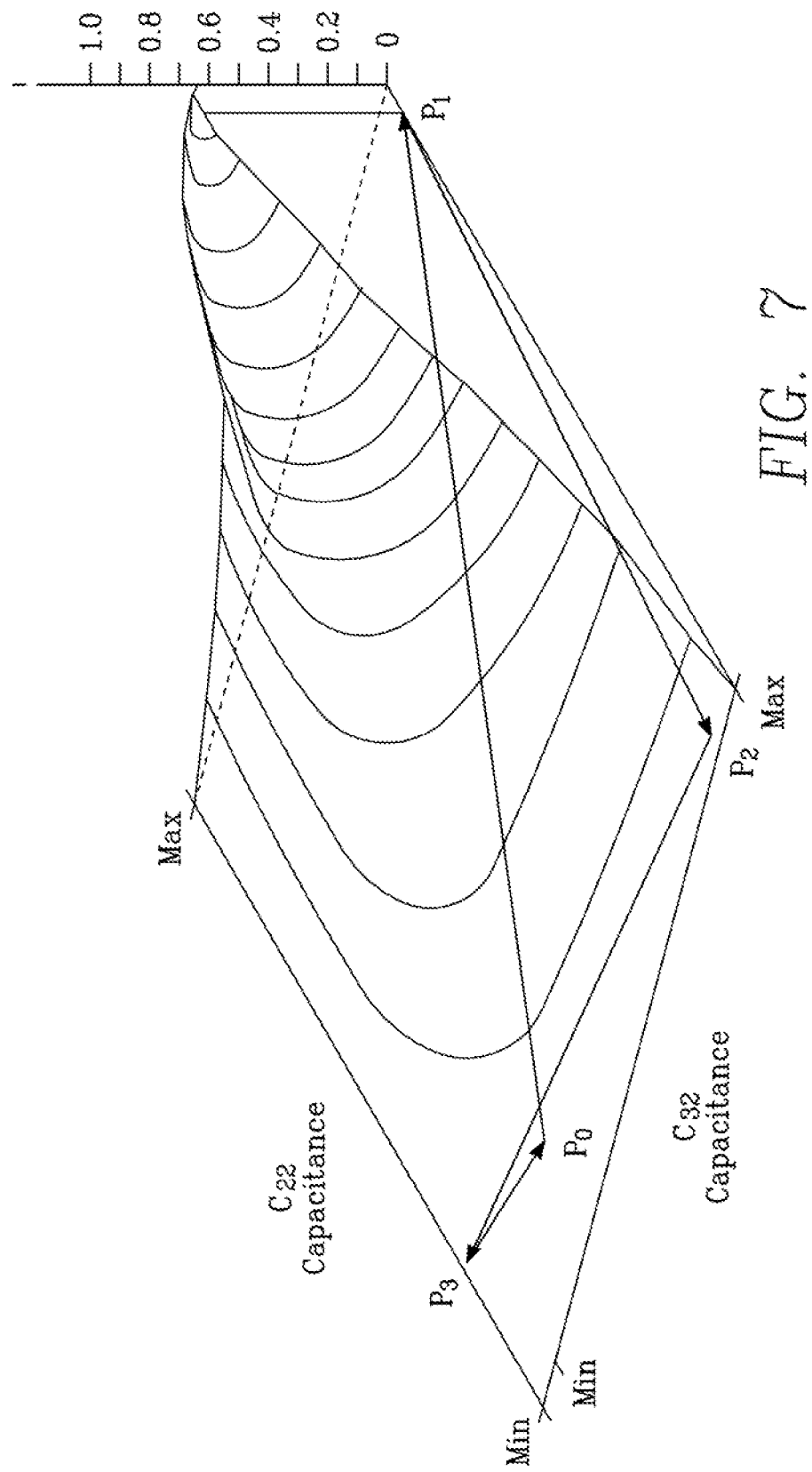
FIG. 7 illustrates an example of the outer coil current as a 3-dimensional function of the values of two variable capacitors in a current divider of FIG. 3B, relative to total current in all three coils.
Figure 8:
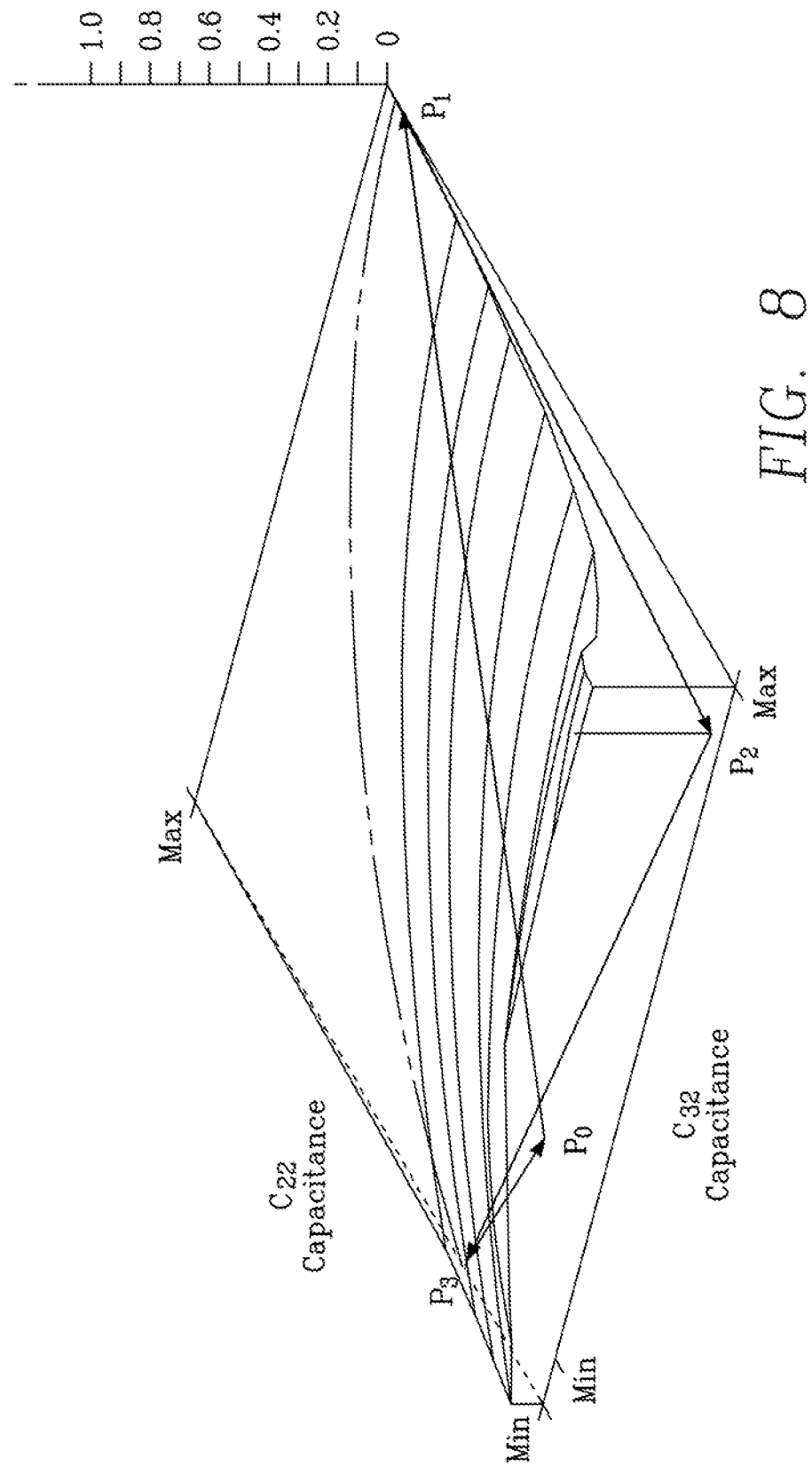
FIG. 8 illustrates an example of the middle coil current as a 3-dimensional function of the values of two variable capacitors in the current divider of FIG. 3B, relative to total current in all three coils.
Figure 9:
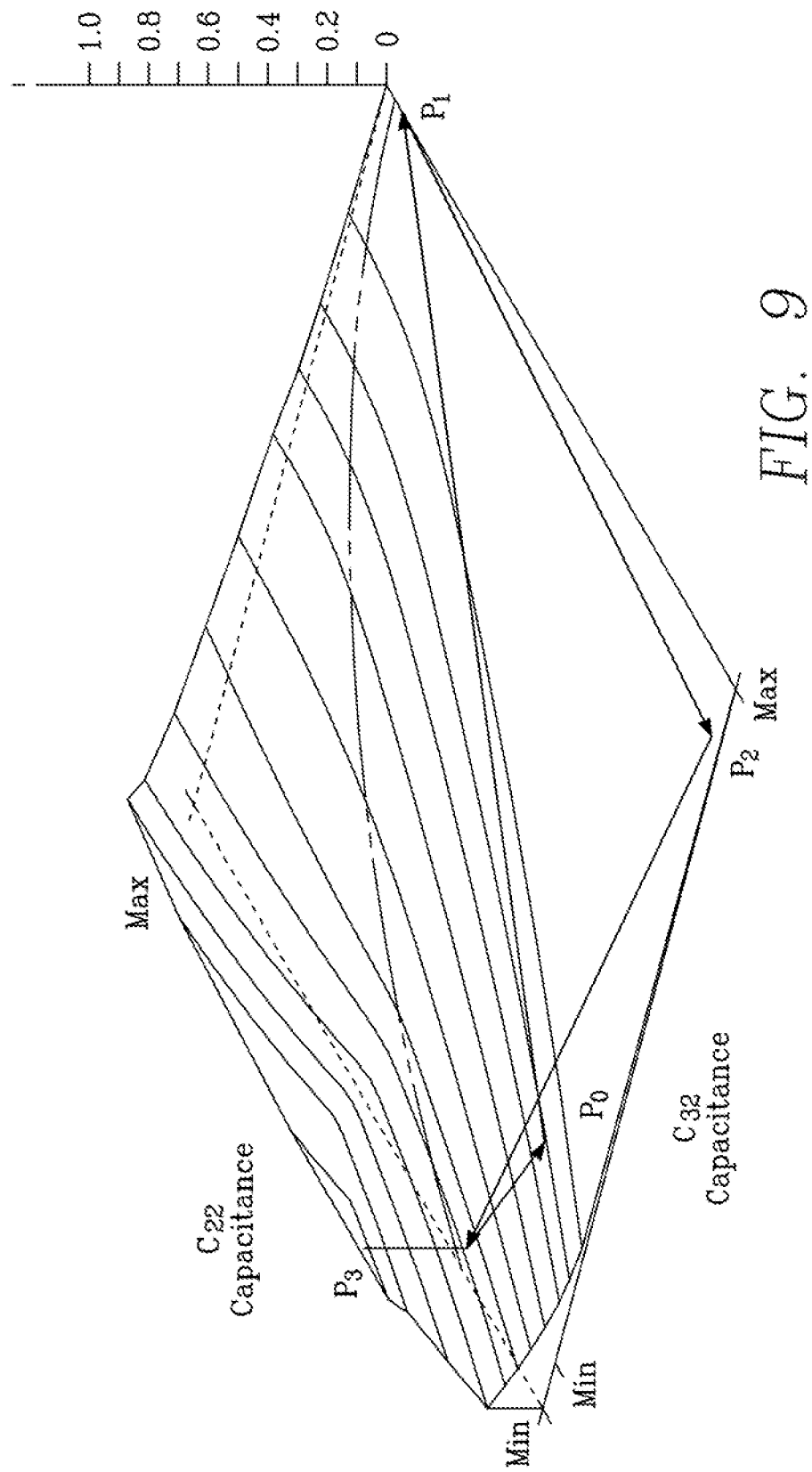
FIG. 9 illustrates an example of the inner coil current as a 3-dimensional function of the values of two variable capacitors in a current divider of FIG. 3B, relative to total current in all three coils.

Returning now to FIG. 4, in one embodiment, the equation solver 172 is adapted to solve the simultaneous equations of the model 170 for the three coil currents as three two-dimensional functions $I_1$, $I_2$ and $I_3$ of the values of the two variable capacitors $C_{22}$ and $C_{32}$. The three coil current functions are normalized to the total current through all three coils, and are denoted $I_1'$, $I_2'$, $I_3'$, respectively. Thus, $$I_i'=I_i/[I_1+I_2+I_3]$$

for each value of the index i=1-3. Each two dimensional function $I_1'$, $I_2'$, $I_3'$ is stored in a respective memory 174-1, 174-2 and 174-3. A working example of the two dimensional functions $I_1'$, $I_2'$ and $I_3'$ stored in the memories 174-1, 174-2 and 174-3 is depicted in the graphs of FIGS. 7, 8 and 9 respectively. In each one of FIGS. 7, 8 and 9, a plane is defined by two axes labeled $C_{22}$ (the vertical axis) and $C_{32}$ (the horizontal axis), and may be referred to as the ($C_{22}$, $C_{32}$)-plane or two-dimensional ($C_{22}$, $C_{32}$)-space. The magnitude of the coil current in each graph of FIGS. 7-9 is depicted on an axis orthogonal to the ($C_{22}$, $C_{32}$)-plane.

FIGS. 7, 8 and 9 demonstrate a remarkable aspect of our discovery, namely that only two variable capacitors, and $C_{22}$ and $C_{32}$ are needed to realize nearly all possible apportionments of the three coil currents $I_1'$, $I_2'$ and $I_3'$. The ability to cover such a large range of apportionments is due in part to the relatively gradual slopes characterizing the peaks in each of the graphs of FIGS. 7-9.

Figure 10:
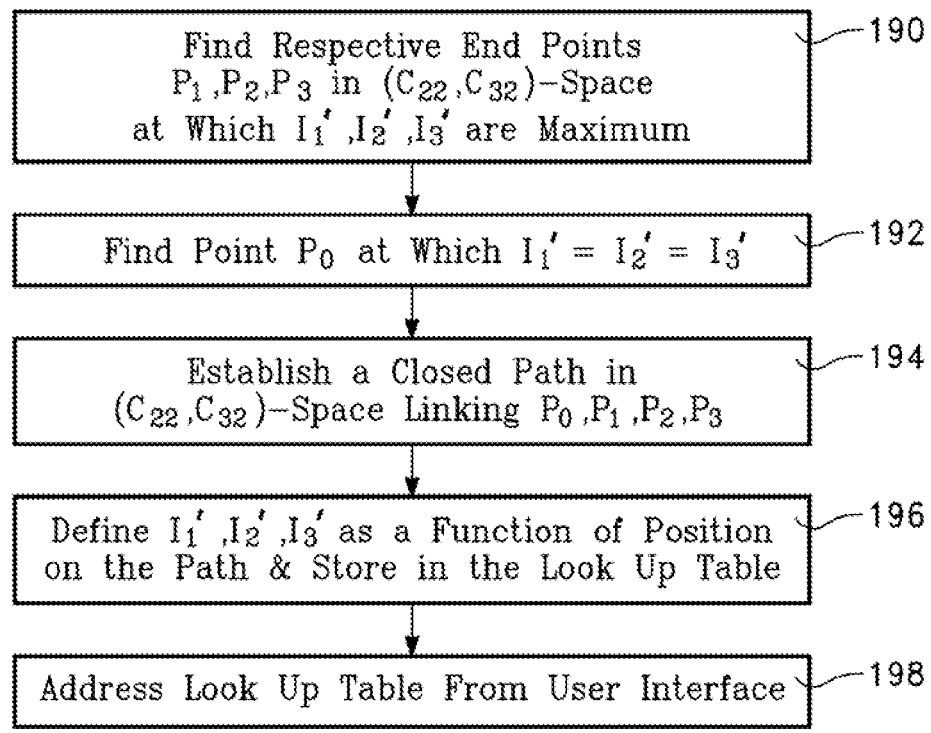
FIG. 10 depicts a method for programming and operating a programmable path processor.

One problem is how to easily find the pair of capacitor values for $C_{22}$ and $C_{32}$ (out of all possible combinations) that provides the exact (or nearly exact) apportionment of $I_1'$, $I_2'$ and $I_3'$ specified by the user. This problem is solved in a first embodiment by a parameter path processor 176. Referring to FIG. 10, the parameter path processor 176 can foe implemented by software or by a human operator as follows: Find three respective points P1, P2 and P3 in two-dimensional ($C_{22}$, $C_{32}$)-space at which a respective one of $I_1'$, $I_2'$ and $I_3'$ is maximum (block 190 of FIG. 10). Find a point P0 in two-dimensional ($C_{22}$, $C_{32}$)-space at which, at least approximately, $I_1'=I_2'=I_3'$ (block 192 of FIG. 10). Next, establish a linear programming path in two-dimensional ($C_{22}$, $C_{32}$)-space that includes all four points P0, P1, P2 and P3 (block 194 of FIG. 10). Preferably, the path segments between pairs of the points P0, P1, P2 and P3 are straight lines. A user may then vary $C_{22}$ and $C_{32}$ along the pre-established linear programming path by varying only one parameter, until a desired apportionment of $I_1'$, $I_2'$ and $I_3'$ is found (e.g., by trial and error). The user may need to depart from the programming path to obtain optimum results, particularly if the plasma operating conditions (e.g., chamber pressure) used to implement the model have changed, after the look-up tables were generated from the model.

In another embodiment, the parameter path processor 176 uses the two-dimensional functions of $I_1'$, $I_2'$ and $I_3'$ to calculate corresponding discrete values of $I_1'$, $I_2'$ and $I_3'$ at successive points along the linear programming path and stores these values in a look-up table 180 as a function of position along the linear programming path processor (block 196 of FIG. 10). In one embodiment, during operation, a desired value of $C_{22}$ and $C_{32}$ may be found, quickly by addressing the look-up table with a discrete set of desired values of $I_1'$, $I_2'$ and $I_3'$ provided from a user interface 182 (block 198 of FIG. 10).

Figure 11:
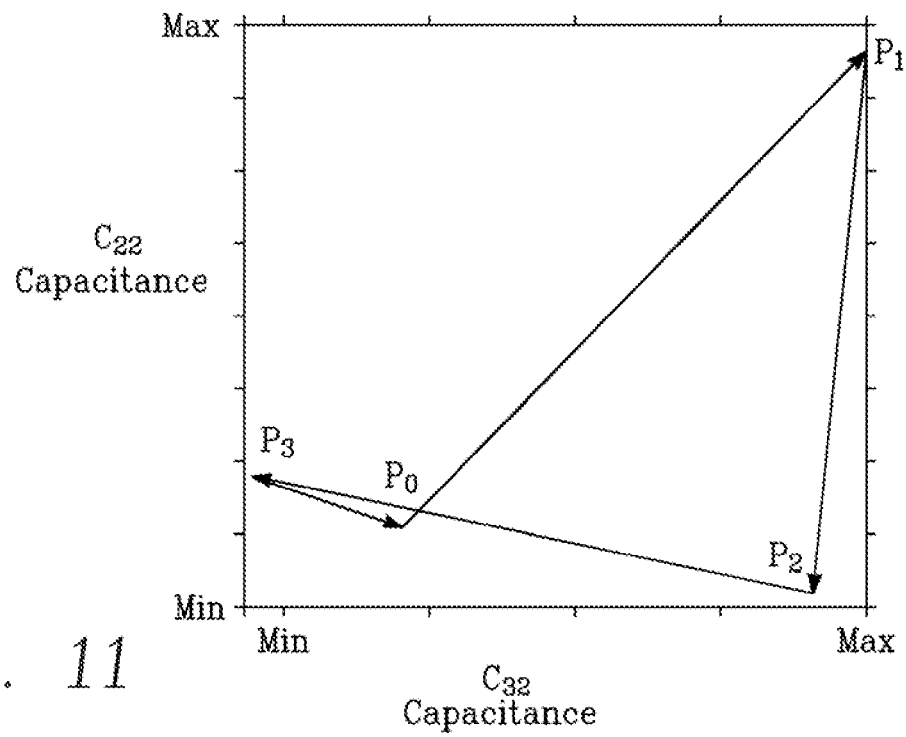
FIG. 11 is a graph depicting a linear programming path defining a scalar programming parameter employed in one embodiment of the processor of FIG. 4.
Figure 12A:
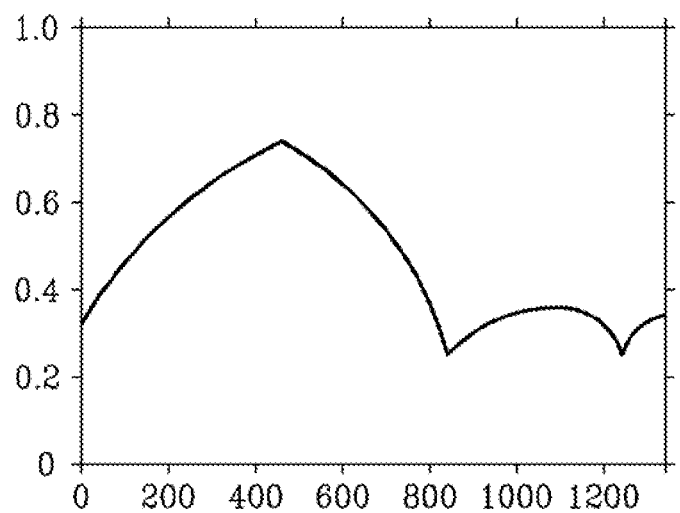
FIG. 12A is a graph depicting the current in the outer coil as a function of position along the programming path of FIG. 10, relative to total current in all three coils.
Figure 12B:
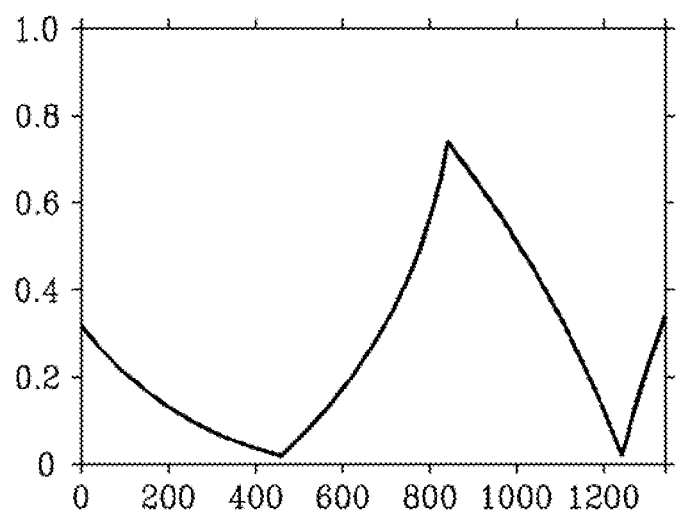
FIG. 12B is a graph depicting the magnitude of the current in the middle coil as a function of position along the programming path of FIG. 10, relative to total current in ail three coils.
Figure 12C:
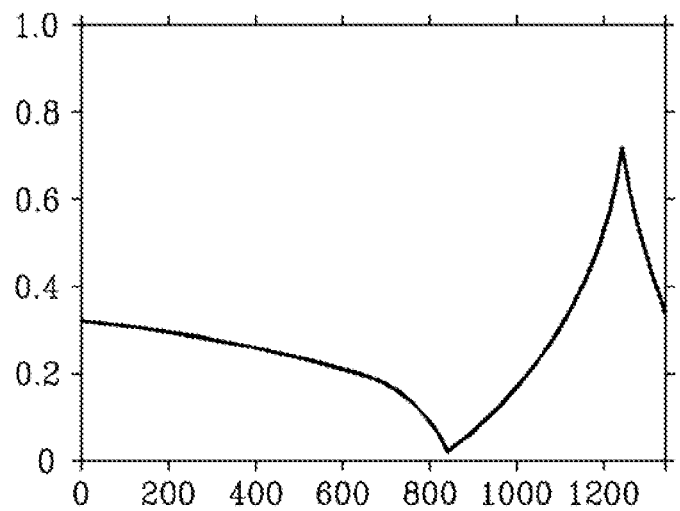
FIG. 12C is a graph depicting the current in the inner coil as a function of position along the programming path of FIG. 10, relative to total current in all three coils.

An example of a linear programming path is depicted in FIG. 11 lying in the ($C_{22}$, $C_{32}$)-plane, and corresponds to the locations of peaks in each of the graphs of FIGS. 7-9. The same linear programming path is superimposed on the ($C_{22}$, $C_{32}$)-plane in each of FIGS. 7-9. FIGS. 12A, 12E and 12C are graphical representations of the contents of the look-up table 180 of FIG. 4 for $I_1'$, $I_2'$ and $I_3'$, respectively. For each position along the linear programming path of FIG. 11 (horizontal axis of FIGS. 12A-12C), a corresponding discrete magnitude of a respective one of $I_1'$, $I_2'$ and $I_3'$ (vertical axis) is given.

In one embodiment, once a representation of the linear programming path of FIG. 11 is stored in the look-up table 180, the other components of the processor 164 may be deactivated or removed, and only the look-up table 180 is required for complete control, unless or until operating conditions or reactor geometries are significantly altered. Thus, in a highly economical implementation, the look-up table 180 is programmed in the factory in the manner previously described with reference to blocks 190-196. Then, the components of the processor 164 are removed with the exception of the look up table 180, and the reactor is shipped. Variations in processing conditions may be accommodated by furnishing different look-up tables that have been programmed in accordance with the different processing conditions.

Figure 13:
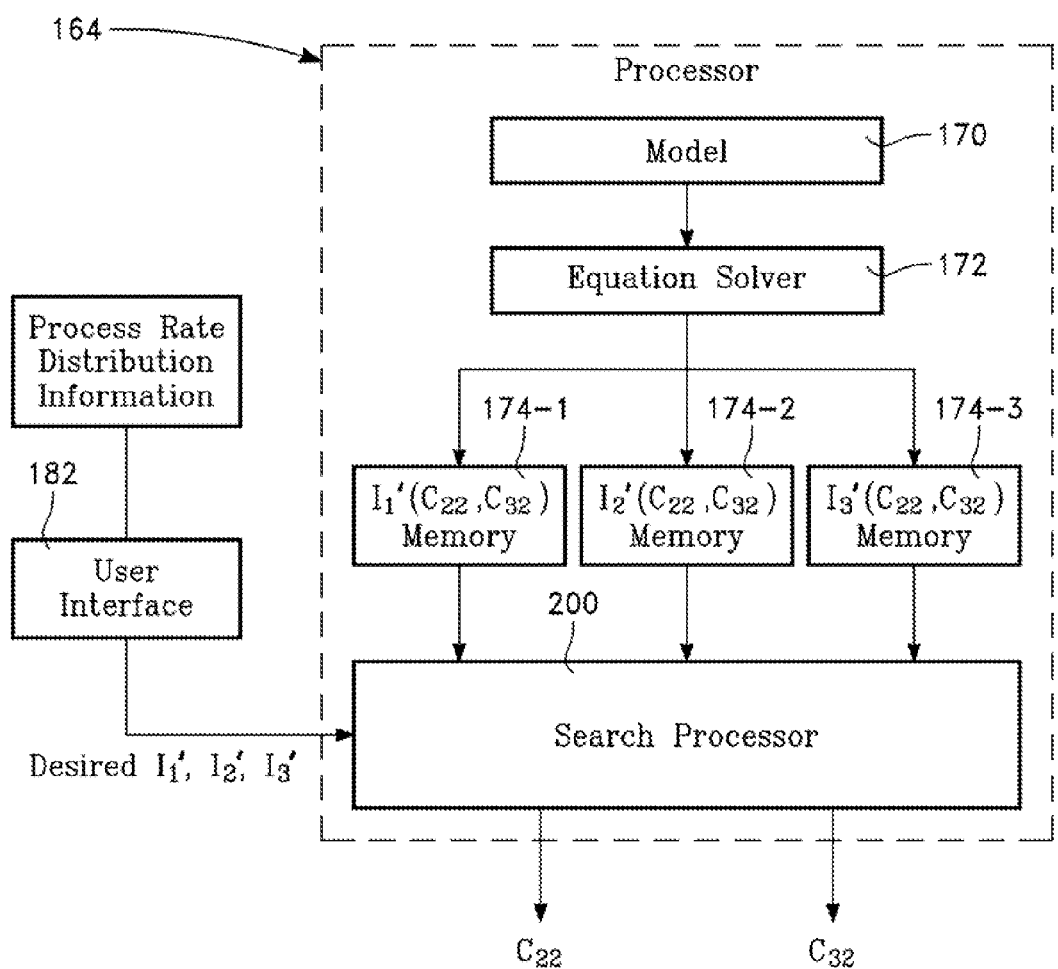
FIG. 13 is a schematic block diagram of an alternative embodiment of the processor of FIG. 4 that employs a search operation instead of a linear programming path.

FIG. 13 depicts a related embodiment, in which a linear programming path is not employed. Instead, in FIG. 13 the processor 164 includes a search processor 200 in place of the programmable path processor 176 of FIG. 4. The search processor 200 of FIG. 13 is adapted to search through the three 2-dimensional functions stored in the memories 174-1, 174-2 and 174-3 to find a pair of values of $C_{22}$ and $C_{32}$ that provides a set of discrete values of $I_1'$, $I_2'$ and $I_3'$ most closely resembling the desired values specified by the user interface 132. The user interface 182 may facilitate the selection of apportionment of the discrete values of $I_1'$, $I_2'$ and $I_3'$ by referring to process rate distribution information. Such information may reveal a pattern of non-uniformity in process rate distribution, enabling a user (or intelligent machine) to counteract a perceived non-uniformity pattern by selecting a countervailing pattern of the three coil currents.

In one embodiment, once the data in the memories 174-1, 174-2 and 174-3 are populated, the components 170 and 172 may be removed or deactivated for a more economical implementation. Such a reactor may be delivered with a set of tables stored in the memories 174-1, 174-2 and 174-3 to facilitate a range of chamber operating conditions and/or chamber geometries and/or source geometries.

Any one of the variable or fixed capacitors $C_{21}$, $C_{22}$, $C_{31}$ and/or $C_{32}$ of FIG. 3 may be combined with an additional impedance element (not illustrated), such as an inductor or a resistor, for example, in carrying out the embodiments described above with reference to FIGS. 1A-13.

Figure 14:
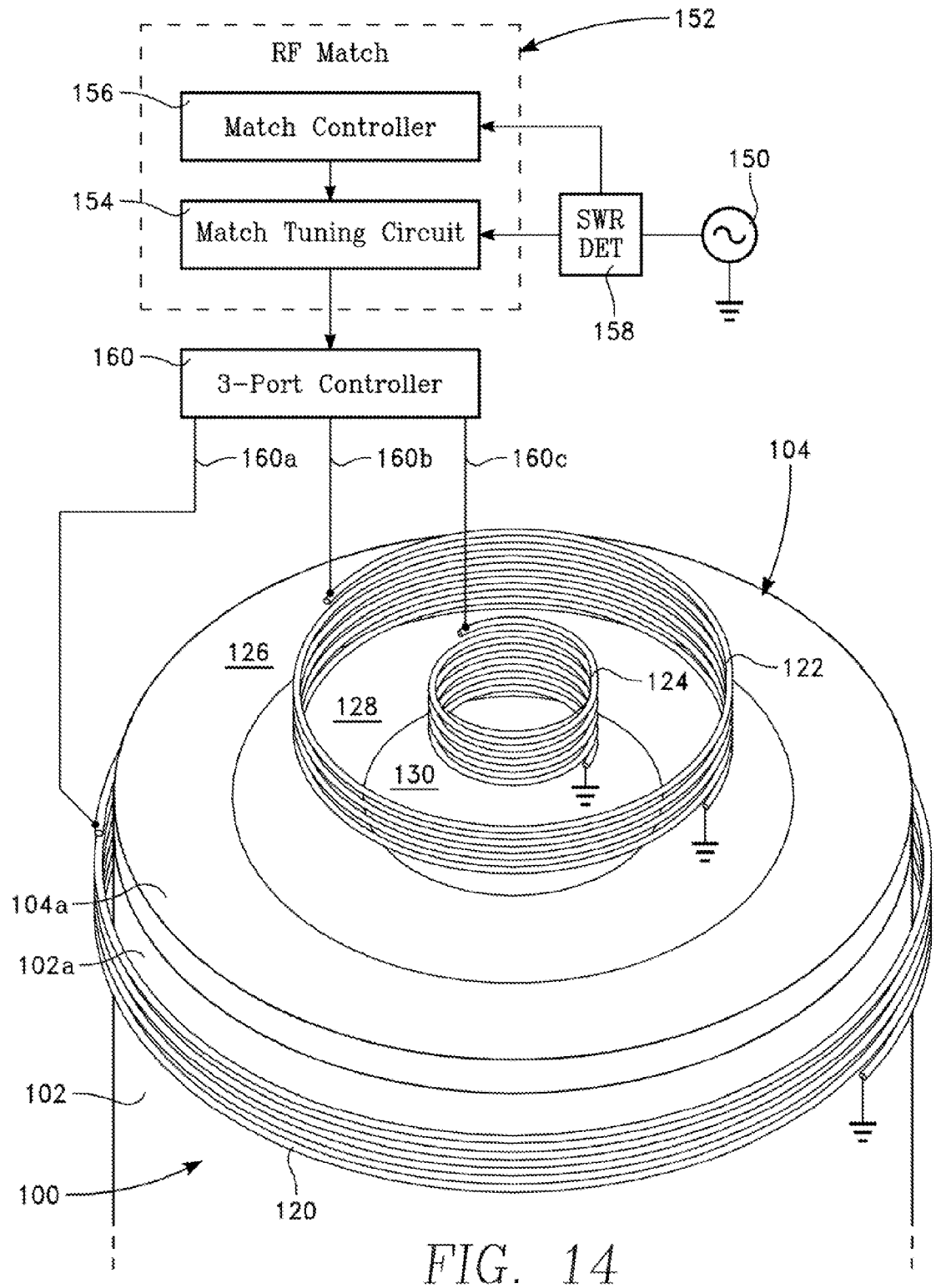
FIG. 14 depicts a modification of the embodiment of FIG. 1A in which the outermost coil antenna is a side coil antenna.

FIG. 14 depicts a version of the embodiment of FIG. 1A, in which the outer coil 120 is wrapped around the side wall 102.

In FIG. 14, the outer coil 120 may be below the plane of the ceiling 104. The side wall 102 may include a cylindrical dielectric window 102a and the ceiling 104 may include a disk-shaped dielectric window 104a, for example.

Figure 15:
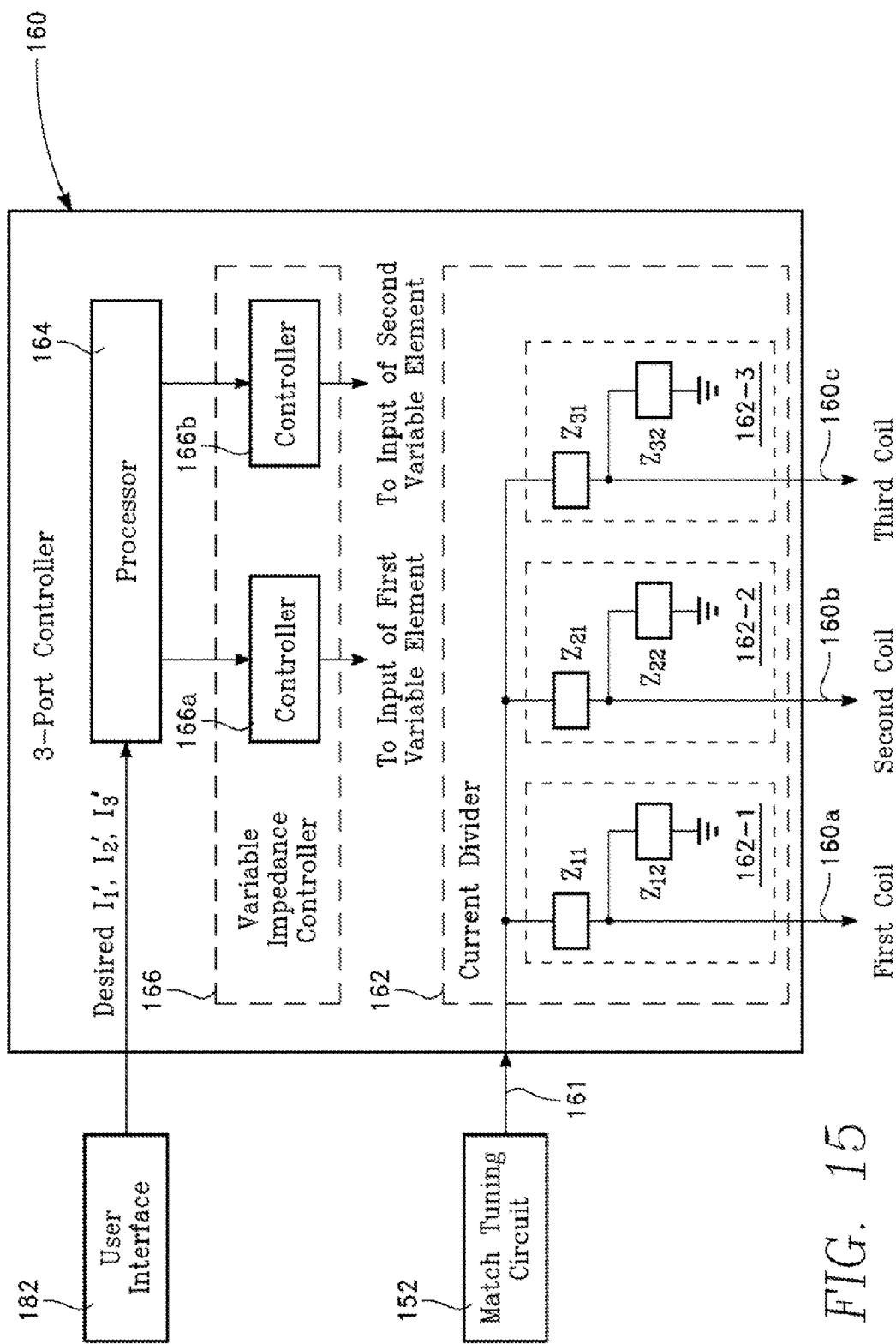
FIG. 15 is a simplified block diagram depicting a general form of the 3-port controller of FIG. 3B, configurable in numerous operable species, of which FIG. 3B corresponds to one of the species.

FIG. 15 is a simplified schematic block diagram depicting a general form of the current divider 162 of FIG. 3B. The three branches 162-1, 162-2 and 162-3 of the current divider 162 are referred to in this specification as current divider branches. In FIG. 15, each of the three current divider branches 162-1, 162-2 and 162-3 is depicted as having a generic series impedance element and a parallel impedance element. Thus, the first current divider branch 162-1 includes of a series impedance element $Z_{11}$ and a parallel impedance element $Z_{12}$, the second current divider branch 162-2 includes of a series impedance element $Z_{21}$ and a parallel impedance element $Z_{22}$, and the third current divider branch 162-3 includes of a series impedance element $Z_{31}$ and a parallel impedance element $Z_{32}$. Each impedance element $Z_{11}$, $Z_{12}$, $Z_{21}$, $Z_{22}$, $Z_{31}$ and $Z_{32}$ includes a capacitor, and, optionally, may include an additional element such as an inductor or a resistor.

A set of rules defining the operable species of FIG. 15 is as follows:

Rule 1: At least two of the three current divider branches 162-1, 162-1 and 162-3 must each have at least one variable impedance element and a series impedance element of a finite non-zero impedance. In some cases, the variable impedance element and the series impedance element may be the same element.

Rule 2: The two variable impedance elements of Rule 1 must tooth be either parallel impedance elements (i.e., they must be any two of $Z_{12}$, $Z_{22}$ and $Z_{32}$), or series impedance elements (i.e., they must be any two of $Z_{11}$, $Z_{21}$, and $Z_{31}$).

Rule 3: The parallel impedance elements (i.e., $Z_{12}$, $Z_{22}$ and $Z_{32}$) may not be short circuits.

Rule 4: If the number of current divider branches having variable impedance elements is exactly two, and if the variable impedance elements are series impedance elements (i.e., it they are any two of $Z_{11}$, $Z_{21}$, and $Z_{31}$), then the remaining branch must have a finite non-zero series impedance element.

An alternative or modified set of rules defining the operable species of FIG. 15 is as follows:

Rule A: At least two of the three current divider branches 162-1, 162-1 and 162-3 must each have at least one variable impedance element and a series impedance element of a finite non-zero impedance, and are referred to herein as "tunable current divider branches". In some cases, the variable impedance element and the series impedance element may be the same element.

Rule B: It is not required that the two variable impedance elements of Rule A are both parallel impedance elements (e.g., any two of $Z_{12}$, $Z_{22}$ and $Z_{32}$), or both series impedance elements (e.g., any two of $Z_{11}$, $Z_{21}$, and $Z_{31}$), in that, in some cases, one may be a parallel impedance element while the other a series impedance element.

Rule C: The parallel impedance elements (i.e., $Z_{12}$, $Z_{22}$ and $Z_{32}$) may not be short circuits.

Rule D: If the number of tunable current divider branches as defined in Rule A is exactly two, and if at least one of the variable impedance elements is a series impedance element (i.e., any of $Z_{11}$, $Z_{21}$, or $Z_{31}$), then the remaining branch mast have a finite non-zero series impedance element.

The current divider 162 of FIG. 3B is an operable species within the foregoing rules defining operable species of FIG. 15, in which $Z_{11}=0$ (is a short circuit), $Z_{12}=\infty$ (is open) and $Z_{22}$ and $Z_{32}$ are the variable impedance elements.

Figure 16:
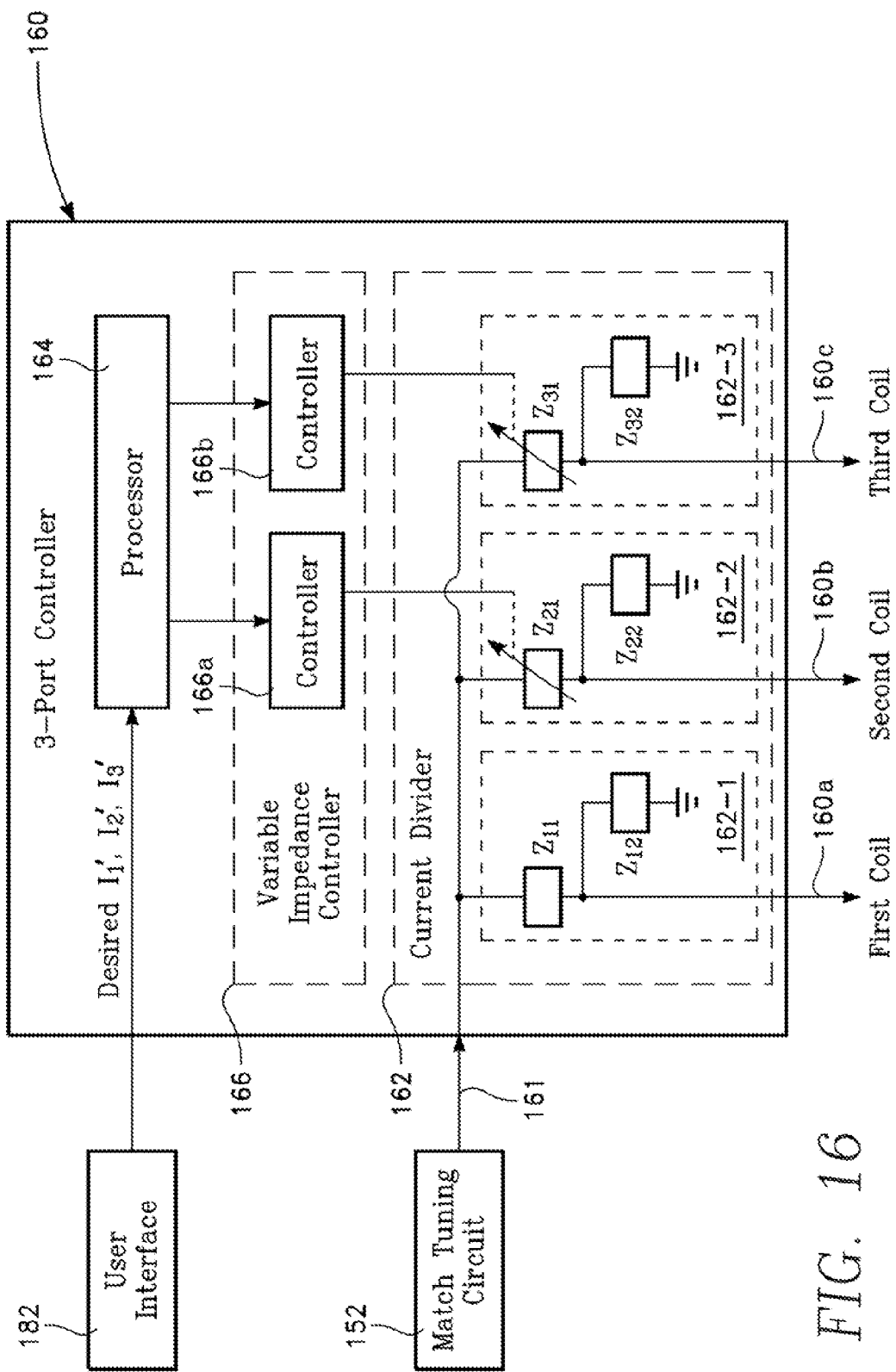
FIG. 16 is a block diagram depicting another one of the operable species of FIG. 15.

Another operable species is depicted in FIG. 16, in which the series impedance elements $Z_{11}$, $Z_{21}$, and $Z_{31}$ are each non-zero finite impedances and two of them are variable, and in which the parallel impedance elements ($Z_{12}$, $Z_{22}$ and $Z_{32}$) are of any impedance values (including infinity) other than zero. In the specific example of FIG. 16, the two variable impedance elements are $Z_{21}$ and $Z_{31}$.

As used herein, the term "current divider branch" or "current branch" refers to each one of a set of three current divider branches conforming to the rules stated above.

In each of the operable species defined above, at least two of the current divider branches have a variable impedance element, which is controlled by a respective one of the controllers 166a, 166b of FIG. 15.

Figure 17:
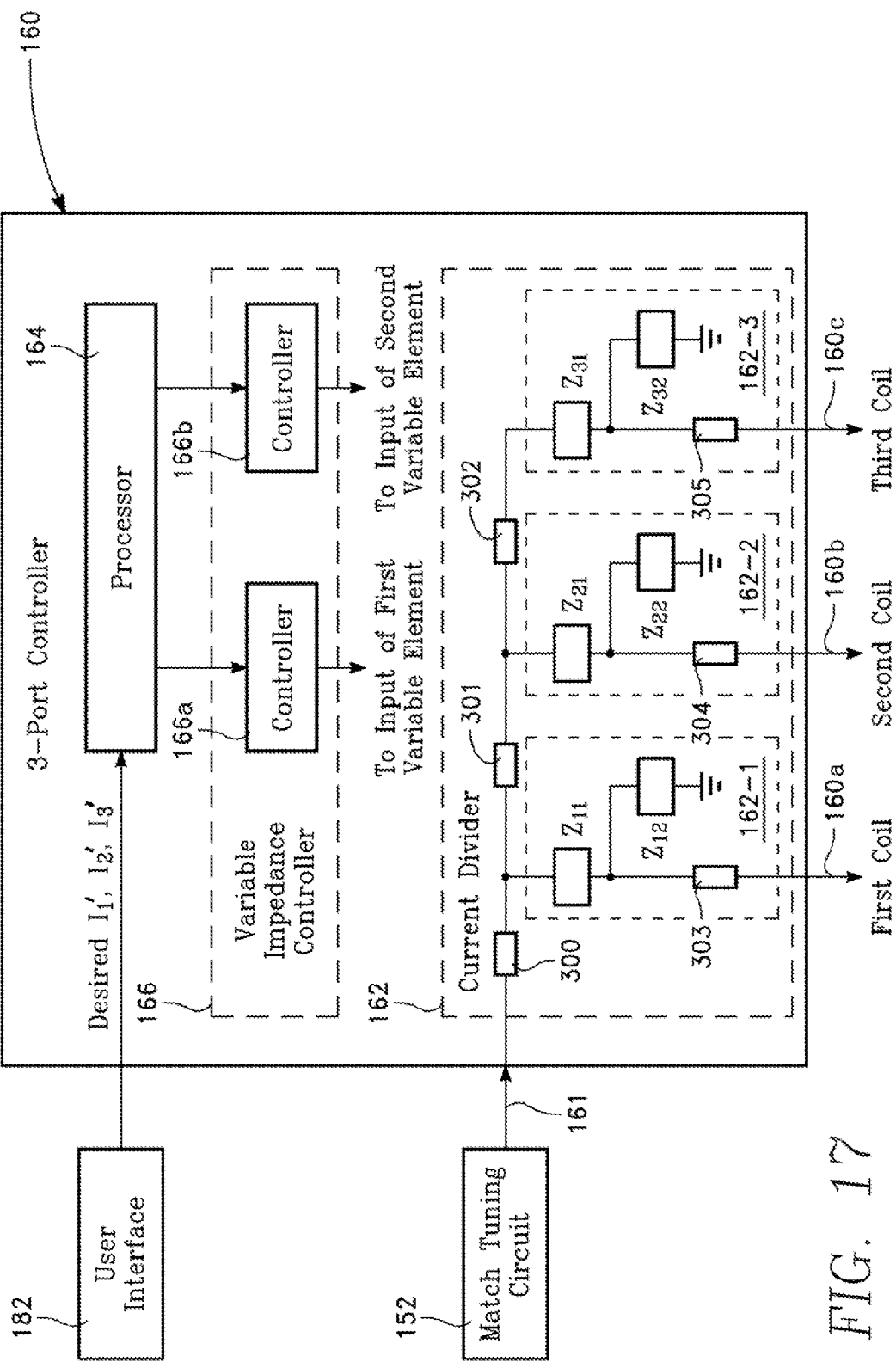
FIG. 17 is a block diagram depicting variations of the embodiment of FIG. 15 in which one or more optional series impedance elements are introduced.

In each of the operable species defined above, each current divider branch 162-1, 162-2, 162-3 is coupled between the output of the match tuning circuit 152 and a respective one of the coil antennas. In the embodiments of FIG. 15, this coupling is a direct connection from the match tuning circuit 152 to each current divider branch 162-1, 162-2, 162-3. FIG. 17 depicts an equivalent embodiment, in which coupling of the match tuning circuit 152 to each current divider branch 162-1, 162-2, 162-3 is indirect and is made through intervening series impedances 300, 301 and/or 302, and in which coupling of each current divider branch 162-1, 162-2, 162-3 to a respective coil antenna is indirect and is made through intervening series impedances 303, 304 and/or 305. The term "between" is defined in this specification such that each current divider branch 162-1, 162-2, 162-3 is coupled "between" the match tuning circuit 152 and the respective coil antenna whether or not any of the series impedances 300, 301, 302, 303, 304 or 305 are present. Each one of the series impedances 300, 301, 302, 303, 304 or 305 may include a capacitor, an inductor or a resistor.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
   an RF power generator and an impedance match coupled to said RF power generator;
   three coil antennas having respective driven ends and return ends, said return ends being connected to a common potential;
   three current divider branches coupled between said impedance match and the driven ends of respective ones of said coil antennas, each one of a pair of said three current divider branches comprising a respective variable impedance element; and
   a current apportionment controller controlling impedances of said variable impedance elements of said pair of current divider branches in response to a user-specified apportionment of currents among said three coil antennas.

2. The reactor of claim 1 wherein said current apportionment controller comprises:
   a look-up table storing a sequence of pairs of impedance values of said variable impedance elements.

3. The reactor of claim 2 wherein said sequence of pairs of values defines a linear programming sequence.

4. The reactor of claim 3 further comprising a user interface adapted to record a user-selected point along said linear programming sequence and transmit said user-selected point to said current apportionment controller.

5. The reactor of claim 3 wherein said sequence of pairs of values defines a path in a 2-dimensional space whose dimensions are the impedance values of said variable impedance elements.

6. The reactor of claim 5 wherein said path includes:
a reference point at which currents in said three coil antennas are at least approximately equal,
a first point at which current in a first one of said coil antennas, relative to currents a second and third one of said coil antennas, is near a maximum,
a second point at which current in said second coil antenna, relative to currents in said first and third coil antennas, is near a maximum, and
a third point at which current in said third coil antenna, relative to currents in said first and second coil antennas, is near a maximum.

7. The reactor of claim 1 wherein said apportionment controller comprises:
a memory containing data representing respective currents in said three coil antennas relative to total current as functions of values of said variable impedance elements;
a processor for determining from said data the impedance values of said variable impedance elements at which said respective currents in said three coil antennas at least nearly correspond to said user-specified apportionment.

8. A method of individually controlling currents in three coil antennas of a plasma reactor supplied from an RF generator through an RF impedance match, comprising:
providing respective current divider branches between said impedance match and respective ones of said coil antennas, each of at least two of said current divider branches comprising a respective variable impedance element;
providing a model comprising a first set of equations defining voltage drops in said current divider branches in accordance with mutual inductances of said coil antennas and corresponding portions of a plasma in said reactor and a second set of equations defining voltage drops in said corresponding portions of said plasma in accordance with said mutual inductances;
solving said first and second sets of equations for currents in said coil antennas relative to total current as 3-dimensional functions of impedance values of said variable impedance elements in said at least two current divider branches;
correlating information corresponding to said 3-dimensional functions to a user-defined apportionment of currents in said coil antennas.

9. The method of claim 8 wherein said correlating comprises:
searching said functions for respective points in a space representing pairs of values of said variable impedance elements at which coil currents are maximum for respective ones of said coil antennas;
defining a linear programming path that includes said respective points;
responding to a user selection of a location on said linear programming path by controlling impedance values of said variable impedance elements in accordance with said location.

10. The method of claim 9 wherein said correlating comprises:
searching said functions for a set of impedance values of said variable impedance elements corresponding to an apportionment of currents among said coil antennas that at least nearly approximates a user-defined apportionment.

11. A method of individually controlling currents in three coil antennas of a plasma reactor supplied from an RF generator through an RF impedance match, comprising:
providing respective current divider branches between said impedance match and respective ones of said coil antennas, at least two of said current divider branches comprising a respective variable impedance element;
correlating information, corresponding to coil antenna currents as 3-dimensional functions of impedance values of said variable impedance elements, to a user-defined apportionment of currents in said coil antennas.

12. The method of claim 11 wherein said correlating comprises:
defining respective points in a space representing pairs of values of said variable impedance elements at which coil antenna currents are maximum for respective ones of said coil antennas;
defining a linear programming path that includes said respective points;
responding to a user selection of a location on said linear programming path by controlling impedance values of said variable impedance elements in accordance with said location.

13. A plasma reactor for processing a workpiece, comprising:
an RF power generator and an impedance match coupled to said RF power generator;
three coil antennas having respective driven ends and return ends, said return ends being connected to a common potential;
a pair of current divider branches each comprising respective series and parallel impedance elements, the series impedance element of each of said pair of current divider branches being of an impedance value other than zero or infinity and being coupled between said impedance match and the driven end of a respective one of said, coil antennas, the parallel impedance element of each of said pair of current divider branches being of an impedance value other than zero and being coupled in parallel with a respective one of said coil antennas;
a third current divider branch coupled between said impedance match the driven end of a third one of said three coil antennas; and
a current apportionment controller controlling impedances of either (a) said series impedance elements of said pair of current divider branches or (b) said parallel impedance elements of said pair of current divider branches, in response to a user-specified apportionment of currents to said three coil antennas received from a user interface.

14. The reactor of claim 13 wherein said current apportionment controller comprises:
a look-up table storing a sequence of pairs of impedance values of said first and second variable impedance elements.

15. The reactor of claim 14 wherein said sequence of pairs of values defines a linear programming sequence.

16. The reactor of claim 15 wherein said user interface is adapted to record a user-selected point along said linear programming sequence and transmit said user-selected point to said current apportionment controller.

17. The reactor of claim 15 wherein said sequence of pairs of values defines a path in a 2-dimensional space whose dimensions are the impedance values of said variable impedance elements.

18. The reactor of claim 17 wherein said path includes:
- a reference point at which currents in said three coil antennas are at least approximately equal,
- a first point at which current in a first one of said coil antennas, relative to currents in second and third ones of said coil antennas, is near a maximum,
- a second point at which current in said second coil antenna, relative to currents in said first and third coil antennas, is near a maximum, and
- a third point at which current in said third coil antenna, relative to currents in said first and second coil antennas, is near a maximum.

19. The reactor of claim 13 wherein said apportionment controller comprises:
- a memory containing data representing respective currents in said three coil antennas relative to total current as functions of values of said impedance elements;
- a processor for determining from said data the values of said impedance elements at which said respective currents in said three coil antennas at least nearly correspond to said user-specified apportionment.

20. The reactor of claim 13 wherein said three coil antennas are concentric and wherein an outermost one of said three coil antennas comprises a side coil antenna, and said reactor comprises a cylindrical side window around which said side coil antenna is disposed.

* * * * *